(12) United States Patent
Danyuk et al.

(10) Patent No.: US 10,404,222 B2
(45) Date of Patent: Sep. 3, 2019

(54) BOOTSTRAPPED APPLICATION ARRANGEMENT AND APPLICATION TO THE UNITY GAIN FOLLOWER

(71) Applicant: Harman International Industries, Incorporated, Stamford, CT (US)

(72) Inventors: Dimitri Danyuk, Milford, CT (US); Todd A. Eichenbaum, Oxford, CT (US)

(73) Assignee: Harman International Industries, Incorporated, Stamford, CT (US)

( * ) Notice: Subject to any disclaimer, the term of this patent is extended or adjusted under 35 U.S.C. 154(b) by 3 days.

(21) Appl. No.: 15/687,301

(22) Filed: Aug. 25, 2017

(65) Prior Publication Data
US 2019/0068134 A1   Feb. 28, 2019

(51) Int. Cl.
  *H03F 1/38*    (2006.01)
  *H03F 3/343*   (2006.01)
  *H03F 3/30*    (2006.01)

(52) U.S. Cl.
  CPC .......... *H03F 1/38* (2013.01); *H03F 3/3076* (2013.01); *H03F 3/3432* (2013.01); *H03F 3/3066* (2013.01); *H03F 3/3071* (2013.01); *H03F 2200/219* (2013.01); *H03F 2200/375* (2013.01)

(58) Field of Classification Search
  CPC .......... H03F 1/38; H03F 3/3432; H03F 1/307; H03F 3/3066; H03F 3/3071; H03F 3/3076; H03F 1/3217; H03F 3/26; H03F 3/3067; H03F 2200/375; H03F 2200/219
  USPC ........................................ 330/262, 263, 267
  See application file for complete search history.

(56) References Cited

U.S. PATENT DOCUMENTS

| | | | |
|---|---|---|---|
| 3,418,589 A | 12/1968 | Yee | |
| 3,803,503 A | 4/1974 | Greutman | |
| 4,092,701 A | 5/1978 | Bumgardner | |
| 4,791,383 A * | 12/1988 | Monticelli | H03F 3/3076 330/265 |
| 5,012,134 A | 4/1991 | Kimura | |
| 5,327,098 A | 7/1994 | Molina et al. | |
| 5,359,295 A * | 10/1994 | Nishimura | H03F 1/32 330/262 |

(Continued)

OTHER PUBLICATIONS

Jung, Walt, "Bootstrapped IC Substrate Lowers Distortion in JFET Op Amps", Analog Devices, AN-232 Application Note, Jul. 1992, pp. 74-76.

(Continued)

*Primary Examiner* — Khanh V Nguyen
(74) *Attorney, Agent, or Firm* — Brooks Kushman P.C.

(57) ABSTRACT

An amplifier circuit includes an input amplifier; an output unity gain buffer; and a second unity gain buffer. The output unity gain buffer and the second unity gain buffer are each configured to receive a signal from an input amplifier. The output unity gain buffer is configured to provide an output voltage to an amplifier output, and the second unity gain buffer is configured to provide a bootstrap signal to the input amplifier. A unity gain amplifier includes an input unity gain amplifier; and an output unity gain buffer and a second unity gain buffer. The buffers are configured to receive a signal from an input amplifier. The output unity gain buffer is configured to provide an output voltage to an amplifier output, and the second unity gain buffer is configured to provide a bootstrap signal to the input unity gain amplifier.

18 Claims, 6 Drawing Sheets

(56) References Cited

U.S. PATENT DOCUMENTS

| | | | | |
|---|---|---|---|---|
| 5,515,007 A | * | 5/1996 | Moraveji | H03F 3/3079 |
| | | | | 330/263 |
| 5,786,698 A | | 7/1998 | Mallory | |
| 6,278,326 B1 | * | 8/2001 | Murray | H03F 3/3066 |
| | | | | 323/315 |
| 6,535,063 B1 | * | 3/2003 | Gibson | H03F 1/307 |
| | | | | 330/263 |
| 6,586,998 B2 | * | 7/2003 | Moraveji | H03F 3/3076 |
| | | | | 330/263 |
| 6,657,496 B2 | * | 12/2003 | Chen | H03F 3/3066 |
| | | | | 330/263 |
| 7,262,663 B2 | | 8/2007 | Coley et al. | |

OTHER PUBLICATIONS

King, Grayson et al., Analog Devices, Inc., "Bootstrapping Your Op Amp Yields Wide Voltage Swings", EDN, May 13, 1999, pp. 117-128.

Danyuk, "Supply Bootstrapping Reduces Distortion in Op-Amp Circuits", Electronic Design, Sep. 11, 2008, 3 pages.

* cited by examiner

BOOTSTRAPPED APPLICATION ARRANGEMENT AND APPLICATION TO THE UNITY GAIN FOLLOWER

TECHNICAL FIELD

Aspects of the disclosure generally relate to amplifiers with positive feedback, including unity gain follower amplifiers.

BACKGROUND

Bootstrapping is a technique by which positive feedback of an amplifier output is fed back to an amplifier input in a manner that avoids oscillation. In doing so, bootstrapping increases the apparent value of a fixed resistor as it appears to alternating current signals applied to the input, which thereby increases input impedance of the amplifier circuit.

SUMMARY

In one or more illustrative embodiments, an amplifier circuit includes an input amplifier; an output unity gain buffer; and a second unity gain buffer. The output unity gain buffer and the second unity gain buffer are each configured to receive a signal from an input amplifier. The output unity gain buffer is configured to provide an output voltage to an amplifier output, and the second unity gain buffer is configured to provide a bootstrap signal to the input amplifier.

In one or more illustrative embodiments, an input amplifier; and an output unity gain buffer and a second unity gain buffer, the buffers configured to receive a signal from the input amplifier, wherein the output unity gain buffer is configured to provide an output voltage to an amplifier output, and the second unity gain buffer is configured to provide a bootstrap signal to the input amplifier.

In one or more illustrative embodiments, an amplifier circuit includes an input amplifier including a first pair of complementary transistors arranged in emitter-follower configuration. The amplifier circuit further includes an output unity gain buffer configured to receive an output signal from the input amplifier and to provide an output voltage to an amplifier output utilizing a second pair of complementary transistors. The amplifier circuit further includes a second unity gain buffer configured to receive the output signal from the input amplifier and to provide a bootstrap signal to the input amplifier, the second unity gain buffer including a third pair of complementary transistors configured to drive the collectors of the first pair of complementary transistors.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The present disclosure described herein implements an additional unity gain buffer into an amplifier circuit. The additional unity gain buffer operates in positive feedback loop, sometimes referred to as bootstrapping. The present disclosure accordingly may provide reduction of the input capacitance and source impedance-related errors for an amplifier circuit, with increased bandwidth and output voltage swing. In an example, the present disclosure may be applied to unity gain buffer. Additionally, the above and other advantages of the present disclosure are carried out in one form by an amplifier circuit which includes additional unity gain buffer. Further details are discussed in detail below.

Figure 1:
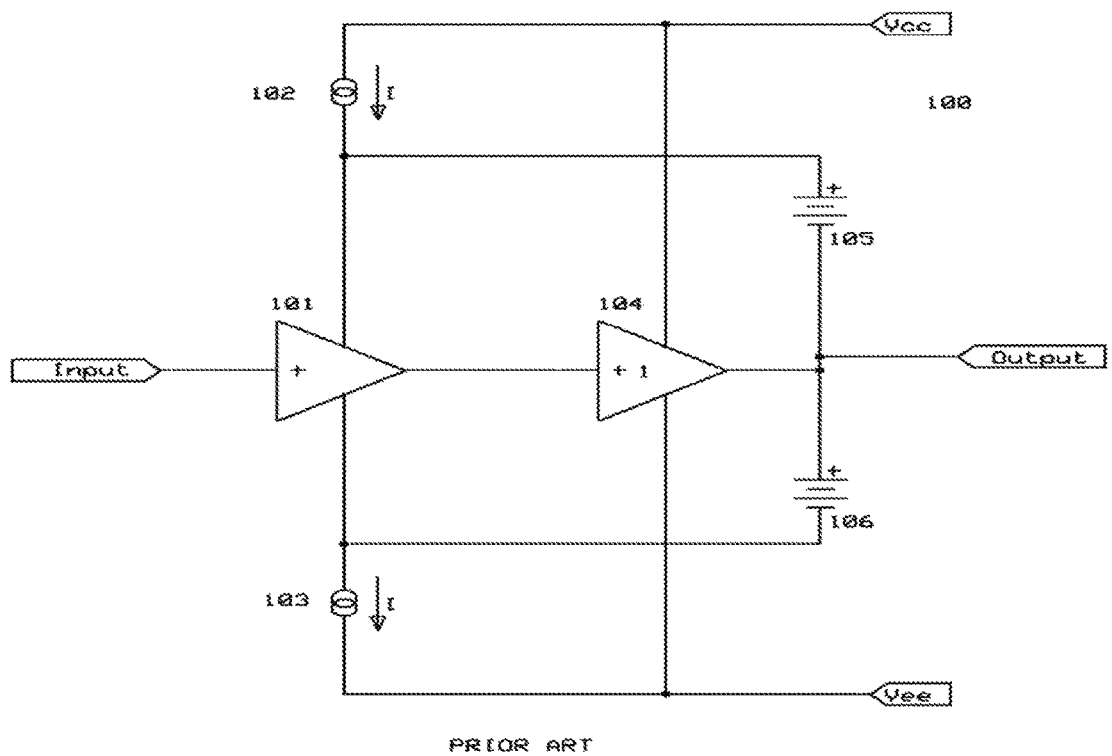
FIG. 1 is a schematic diagram of a prior art amplifier having a bootstrapped input stage.

FIG. 1 shows an equivalent circuit diagram 100 of a basic principle of bootstrapping. In accordance with one or more embodiments, the circuit diagram 100 includes an input amplifier 101, current sources 102, 103, output buffer 104, voltages sources 105, 106, and power supply rails Vcc, Vee. The input amplifier 101 and output buffer 104 may be implemented as operational amplifiers as shown, although discrete transistors or other elements are possible.

The input amplifier 101 may be powered from the two voltage sources 105, 106. In an example, the voltage source 105 is connected to the positive power supply terminal of the input amplifier 101, while the voltage source 106 is connected to the negative power supply terminal of the input amplifier 101. These voltage sources are isolated from direct voltage supply rails by the current sources 102, 103.

Also as shown, an input signal is applied to a non-inverting input terminal of the input amplifier 101. Additionally, an output signal of the input amplifier 101 provided from an output terminal of the input amplifier 101 is supplied to a non-inverting input terminal of the output buffer 104.

The output buffer 104 may be powered directly from the voltage supply rails. For instance, the positive power supply pin of the output buffer 104 may be connected to Vcc, while the negative power supply power supply pin of the output buffer 104 may be connected to Vee. A common terminal of the voltage sources 105, 106 is connected to the output terminal of the output buffer 104. The input amplifier 101 terminals accordingly "float" at the output level with respect to ground.

The design shown in the equivalent circuit diagram 100 reduces different input amplifier errors by bootstrapping the terminals of the input device, substrate, and/or supply rails. Based on its sensed node, the bootstrapping arrangement decreases input capacitance, reduces source impedance-related errors, makes the input amplifying stage faster by shifting the dominant pole to higher frequencies, and allows for high-voltage operation. The degree of improvement depends on the departure of the voltage gain of output buffer from unity. However, because the feedback in a bootstrapping circuit is positive, this arrangement can suffer from reduced stability and noise performance compared to a circuit that lacks bootstrapping. Moreover, reduced stability can be caused by uncontrolled amplifier load, e.g., inductances, capacitances or resistances, appearing at the output terminal.

Figure 2:
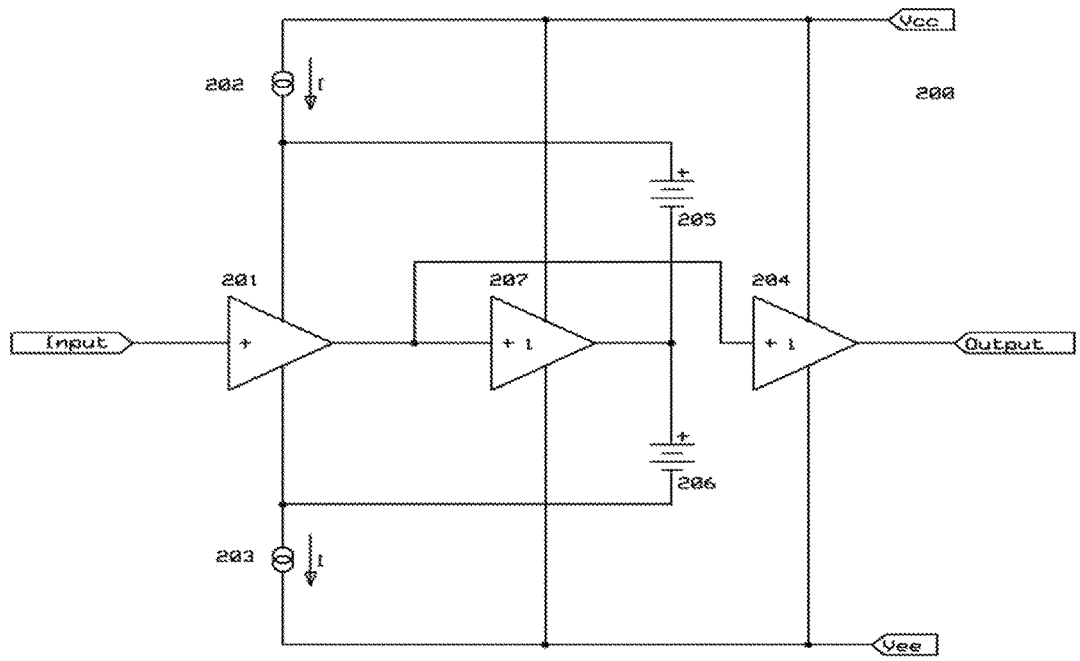
FIG. 2 is a schematic diagram of an amplifier including a bootstrapping configuration of the present disclosure.

FIG. 2 illustrates an amplifying circuit 200 suitably configured for a variety of applications, in accordance with one or more embodiments. As shown, the amplifying circuit 200 includes an input amplifier 201, current sources 202, 203, output stage 204, voltages sources 205, 206, and power supply rails Vcc, Vee. However, as compared to the circuit diagram 100, the amplifying circuit 200 further includes a buffer amplifier 207. The input amplifier 201, output stage 204, and buffer amplifier 207 may each be implemented as operational amplifiers as shown, although discrete transistors or other elements are possible.

The input stage 201 may include an input terminal configured to receive an input signal. As shown, an input signal is applied to a non-inverting input terminal of the input stage 201. Additionally, and similar to as described with respect to the current sources 102, 103 and voltage sources 105, 106 of the circuit diagram 100, current sources 202, 203 and voltage sources 205, 206 are coupled to the power supply connections of the input amplifying stage 201 to facilitate the bootstrapping action.

Also similar to as shown in the circuit diagram 100, the output stage 204 is configured to receive an output from the input amplifying stage 201 and provide an output signal having, in many examples, both a high output current and a high output voltage. However, the output terminal of the output stage 204 is not connected via a common terminal of the voltage sources 205, 206.

Moreover, the amplifying circuit 200 further includes the buffer amplifier 207 configured to provide a stable high output current and voltage. As shown, the buffer amplifier 207 is connected to receive an output from the input stage 201 and provide an output signal to the voltage sources 205, 206. Also, the buffer amplifier 207 is powered directly from the voltage supply rails as is done for the output stage 204. For instance, the positive power supply pin of the output buffer 207 may be connected to Vcc, while the negative power supply power supply pin of the output buffer 207 may be connected to Vee. Notably, the additional buffer amplifier 207 unity gain stage is configured to provide a stable sufficient output current and voltage to drive the terminals of the input stage 201. The additional buffer amplifier 207 accordingly performs bootstrapping action on the input amplifying stage terminals.

Because of the isolating property of the additional buffer amplifier 207, the bootstrapping signal received by the input amplifying stage 201 is not related to the output signal of the output stage 204 in a large extent. Accordingly, the introduction of the additional buffer amplifier 207 makes positive feedback loop controllable and substantially eliminates ringing in the bootstrap signal.

Figure 3:
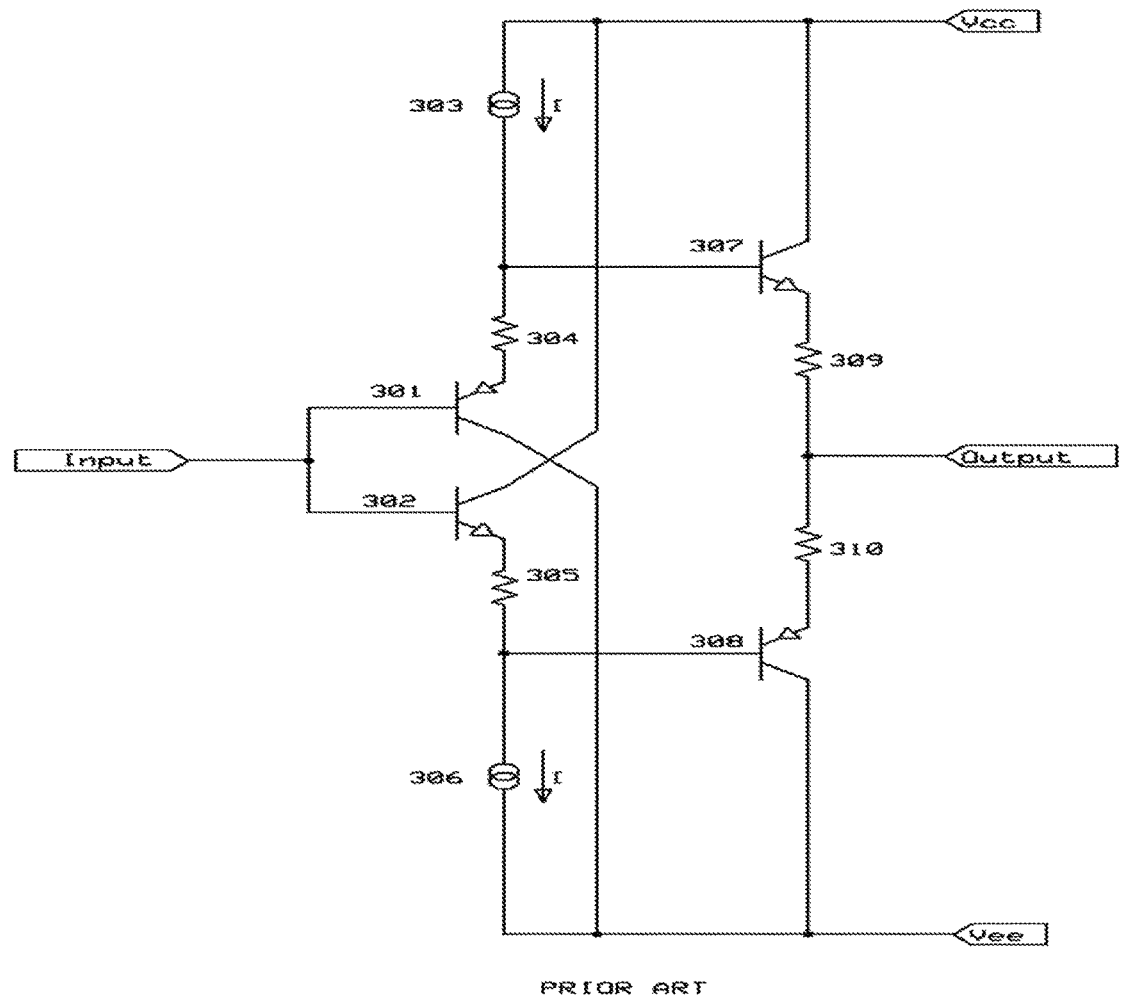
FIG. 3 is a schematic diagram of a prior art offset compensated voltage follower circuit.

FIG. 3 illustrates a unity gain amplifier 300 that provides a combination of a small DC offset voltage and high bandwidth. As shown, the unity gain amplifier 300 includes input and output stages, each containing a pair of complementary transistors arranged in emitter follower configuration (in the illustrated example: PNP transistor 301 and NPN transistor 302 for the input stage, and NPN transistor 307 and PNP transistor 308 for the output stage). The unity gain amplifier 300 further includes current sources 303, 306, emitter resistors 304, 305 for the input stage and 309, 310 for the output stage, and power supply rails Vcc, Vee.

As shown, an input signal applied to an input terminal is provided at the bases of the input stage transistors 301 and 302. The current source 303 is connected to the emitter of transistor 301 through emitter resistor 304, while the current source 306 is connected to the emitter of transistor 302 through emitter resister 305. The collector of transistor 301 is connected to the Vee supply rail, while the collector of transistor 302 is connected to the Vcc supply rail.

Also as shown, the base of transistor 307 is connected to the current source 303, while the base of transistor 308 is connected to the current source 306. The collector of transistor 307 is connected to the Vcc supply rail, while the collector of transistor 308 is connected to the Vee supply rail. The emitter of the transistor 307 is connected to the output through resistor 309, while the emitter of the transistor 308 is connected to the output through resistor 310.

Thus, the pair of complementary symmetry output transistors 307 and 308 is used to drive a load connected directly to the output terminal. Moreover, the current sources 303, 306 connected to the emitters 301, 302 establish the desired quiescent operating current of transistors 301, 302. Yet further, the emitter resistors 304, 305, 309, 310 establish the quiescent operating current through output stage transistors 307, 308.

The quiescent base-emitter voltage of transistor 309 is substantially equal to the base-to emitter voltage of the transistor 301. Similarly, the quiescent base-emitter voltage of transistor 308 is equal to the base-to-emitter voltage drop of the transistor 302. The connection of the collector terminals of input transistors 301,302 to the direct voltage supply rails places the collectors at signal ground which results in the collector to base capacitance of the input being charged by the input signal source.

Additional details of emitter follower amplifiers are discussed in detail in U.S. Pat. No. 3,418,589 to Yee, titled "Complementary emitter follower amplifier biased for class A operation" which is incorporated herein by reference in its entirety.

Figure 4:
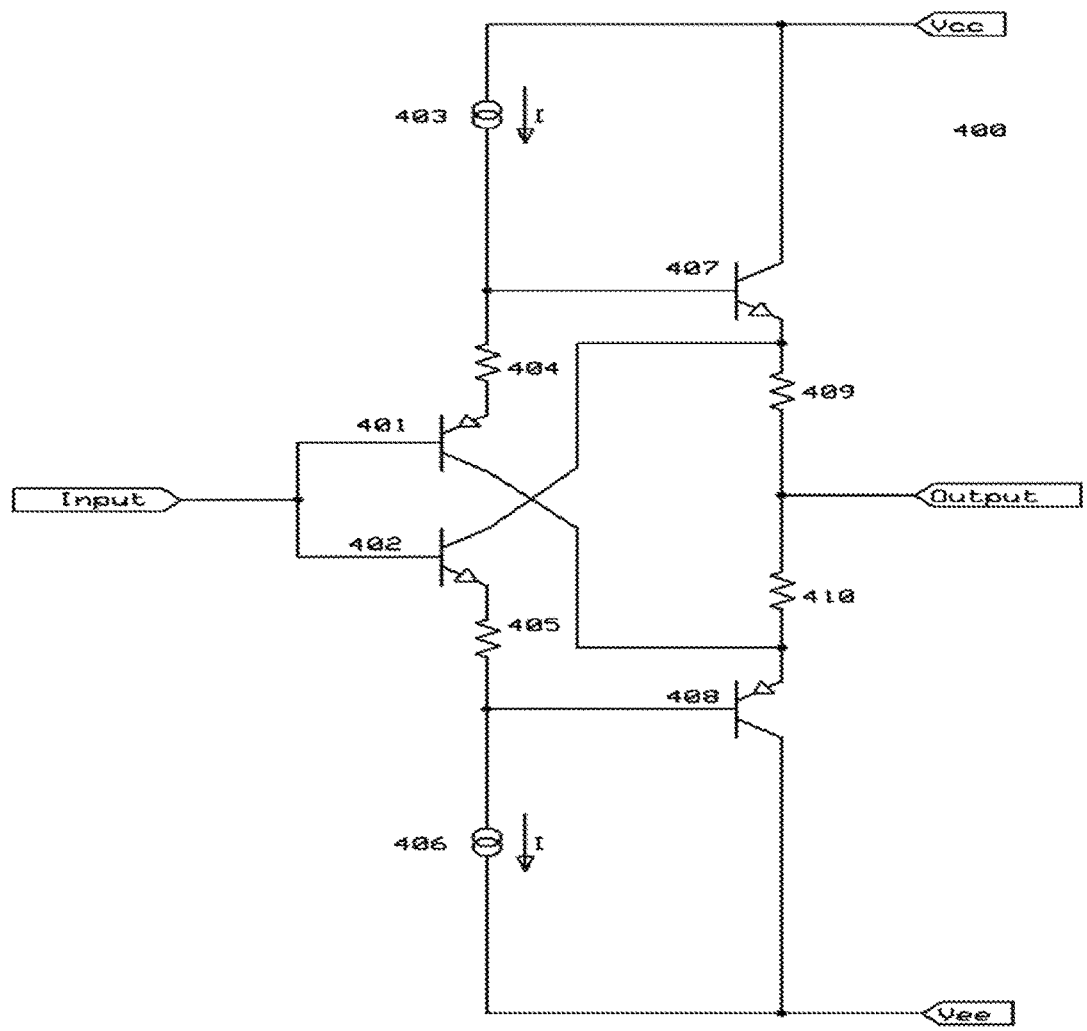
FIG. 4 is a schematic diagram of a prior art offset compensated voltage follower circuit having a bootstrapped input devices.

FIG. 4 illustrates a unity gain amplifier 400 that provides a combination of a small DC offset voltage, high bandwidth and high input impedance. Similar to the unity gain amplifier 300, the unity gain amplifier 400 as shown includes input and output stages, each containing a pair of complementary transistors (PNP transistor 401 and NPN transistor 402 for the input stage, and NPN transistor 407 and PNP transistor 408 for the output stage) arranged in emitter follower configuration. The unity gain amplifier 400 further includes current sources 403, 406, emitter resistors 404, 405 for the input stage and 409, 410 for the output stage, and power supply rails Vcc, Vee.

Also similar to the unity gain amplifier 300, in the unity gain amplifier 400 an input signal applied to an input terminal is provided at the bases of the input stage transistors 401 and 402. The current source 403 is connected to the emitter of transistor 401 through emitter resistor 404, while the current source 406 is connected to the emitter of transistor 402 through emitter resister 405. Also similar to the unity gain amplifier 300, in the unity gain amplifier 400 the base of transistor 407 is connected to the current source 403, while the base of transistor 408 is connected to the current source 406. The collector of transistor 407 is connected to the Vcc supply rail, while the collector of transistor 408 is connected to the Vee supply rail. The emitter of the transistor 407 is connected to the output through resistor 409, while the emitter of the transistor 408 is connected to the output through resistor 410.

However, unlike the unity gain amplifier 300, in the unity gain amplifier 400 the collector of transistor 401 is connected to the emitter of transistor 408, while the collector of transistor 402 is connected to the emitter of transistor 407.

The signal at the collectors of the input pair 401, 402 is similar in phase and amplitude to the input signal. Thus, the impact of collector-base capacitance of the complementary symmetry input transistors 401, 402 on the input impedance is substantially reduced by positive feedback bootstrapping from the emitters of the output transistors 407, 408 to the input stage collectors. The degree of the input capacitance reduction depends strongly on the departure of the gain of the output stage 407, 408 from unity. The gain of the output stage is strongly influenced by a load connected to the output terminal.

Accordingly, the collector-to-base capacitances of the input stage of two pairs of series connected direct coupled complementary emitter follower amplifiers are neutralized by feedback of signal from the output emitters to the input stage collectors. Thus, the unity gain amplifier 400 circuit provides improved coupling between a high impedance source and a low impedance load and has a rapid response to bipolar signal variations over a wide frequency range with low quiescent power requirements. Additional details of similar amplifiers are discussed in detail in U.S. Pat. No. 3,803,503 to Greutman, titled "Neutralized driver amplifier circuit" which is incorporated herein by reference in its entirety.

Figure 5:
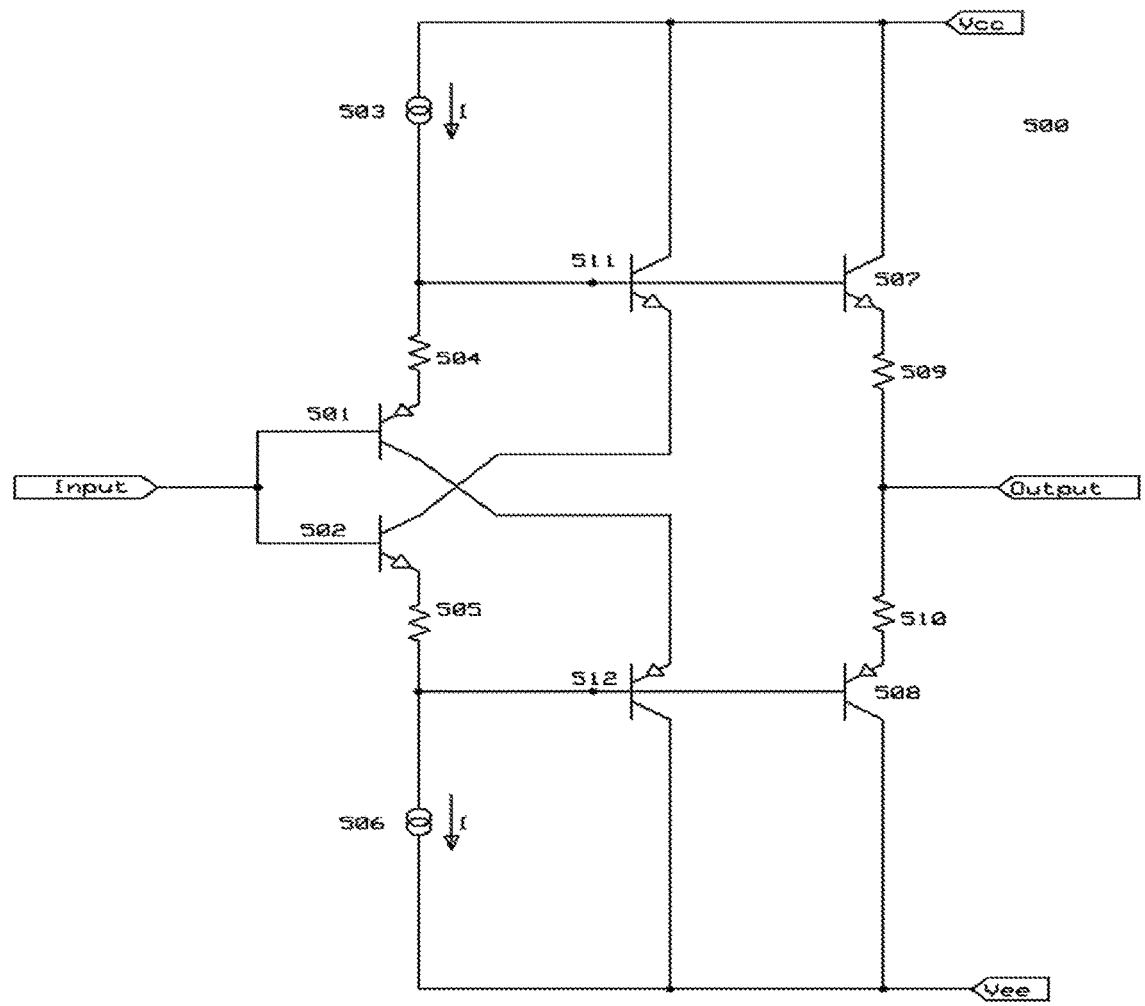
FIG. 5 is a schematic diagram of an offset-compensated voltage follower including a bootstrapping configuration of the present disclosure.

FIG. 5 shows a schematic drawing of a unity gain amplifier circuit 500 in accordance with one or more embodiments. Similar to the unity gain amplifiers 300 and 400, the unity gain amplifier circuit 500 as shown includes input and output stages, each containing a pair of complementary transistors arranged in emitter follower configuration (in the illustrated example: PNP transistor 501 and NPN transistor 502 for the input stage, and NPN transistor 507 and PNP transistor 508 for the output stage). The unity gain amplifier 500 further includes current sources 503, 506, emitter resistors 504, 505 for the input stage and 509, 510 for the output stage, and power supply rails Vcc, Vee. However, beyond that of the unity gain amplifiers 300 and 400, the unity gain amplifier circuit 500 further includes an additional pair of complementary symmetry transistors in addition to the transistors 607 and 508 (in the illustrated example: NPN transistor 511 and PNP transistor 512).

Similar to the unity gain amplifiers 300 and 400, in the unity gain amplifier 500 an input signal applied to an input terminal is provided at the bases of the input stage transistors 501 and 502. The current source 503 is connected to the emitter of transistor 501 through emitter resistor 504, while the current source 506 is connected to the emitter of transistor 502 through emitter resister 505. Also similar to the unity gain amplifiers 300 and 400, in the unity gain amplifier 500 the base of transistor 507 is connected to the current source 503, while the base of transistor 508 is connected to the current source 506. The collector of transistor 507 is connected to the Vcc supply rail, while the collector of transistor 508 is connected to the Vee supply rail. The emitter of the transistor 507 is connected to the output through resistor 409, while the emitter of the transistor 508 is connected to the output through resistor 410.

The additional pair of complementary symmetry transistors 511 and 512 are implemented to drive the collectors of the input complementary pair 501, 502. More specifically, the base of transistor 511 is also connected to the current source 503 similar to the connection of the base of transistor 507. Additionally, the base of transistor 512 is also connected to the current source 506 similar to the connection of the base of transistor 508. Also similar to the connection of transistors 507 and 508, the collector of transistor 511 is connected to the Vcc supply rail, while the collector of transistor 512 is connected to the Vee supply rail. However, the emitter of transistor 511 is connected to the collector of transistor 502, while the emitter of transistor 512 is connected to the collector of transistor 501.

This additional pair of transistor 511 and 512 operates in the similar manner of a bootstrap unity gain amplifier 400 shown in FIG. 4, but the collectors of each input transistor 501, 502 are rising and falling together with signal changes on the output of the additional follower transistors 511, 512. This eliminates output complementary transistors 507, 508 from the positive feedback loop, thus makes the influence of collector-base capacitance of transistors 501, 502 less sensitive to amplifier load impedance.

Figure 6:
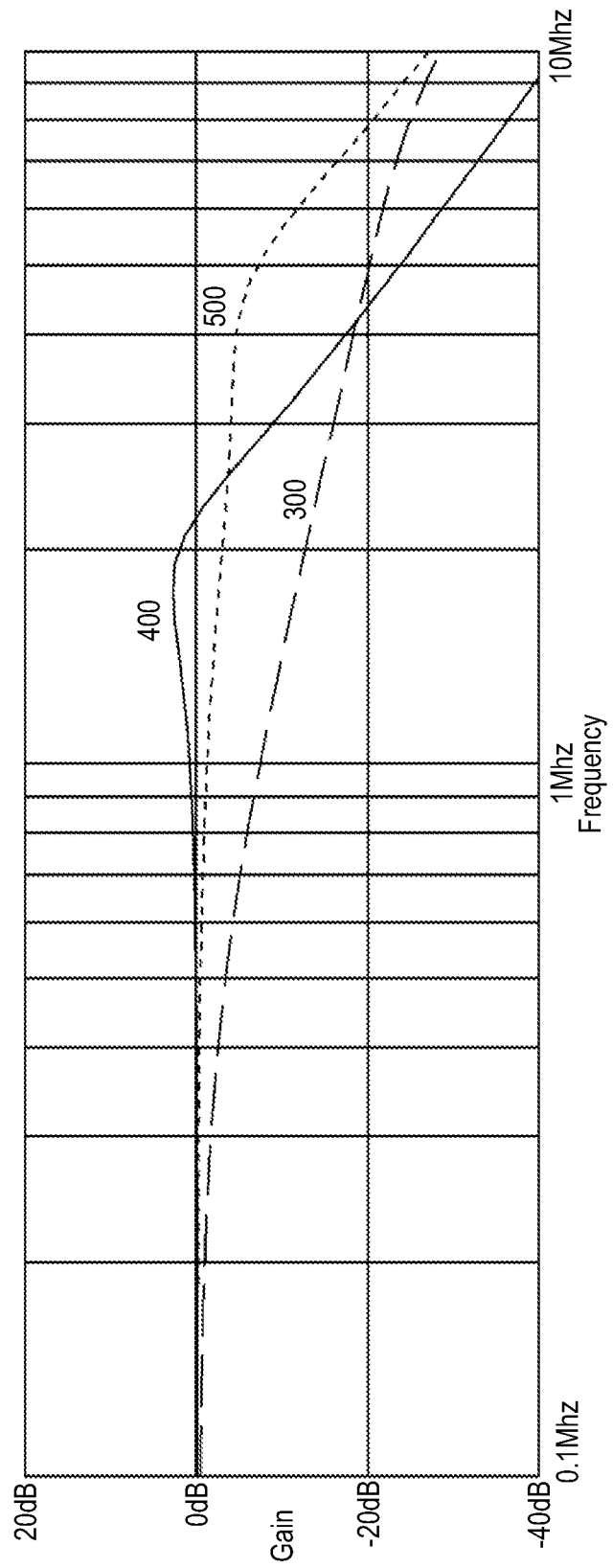
FIG. 6 illustrates an example of measured frequency response for each of the circuits shown in FIGS. 3-5.

FIG. 6 illustrates an example graph 600 of measured frequency response for each of the circuits 300, 400, 500 shown in FIG. 3-5. In the example graph 600, the X-axis represents frequency in a range from 0.1 MHz to 10 MHz, while the Y-axis represents gain in a range from −40 dB to +20 dB. A frequency response plot for the circuit 300 is illustrated as a long-dashed line, a frequency response plot for the circuit 400 is illustrated as a solid line, and a frequency response plot for the circuit 500 is illustrated as a short-dashed line.

For sake of comparison, each of the circuits 300, 400, 500 are constructed to have the following values: a source impedance of 100 kΩ, a load impedance of 1 kΩ in parallel with 1000 pF capacitance, with a quiescent operating current in all devices of ~5 mA, and utilizing BC847/857 complementary bipolar transistors. Notably, as can be seen by comparison of the plots, the unity gain amplifier 500 has extremely high input impedance while at the same time provides an extended frequency response range compared to the unity gain amplifiers 300 and 400.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An amplifier circuit comprising:
    an input amplifier including a base to receive an input voltage signal;
    an output unity gain buffer; and
    a second unity gain buffer,
    wherein the output unity gain buffer and the second unity gain buffer are each configured to receive a signal from the input amplifier, the output unity gain buffer is configured to provide an output voltage to an amplifier output, and the second unity gain buffer is configured to provide a bootstrap signal to the input amplifier.

2. The amplifier circuit of claim 1, wherein the input amplifier is powered from first and second voltage sources isolated from first and second direct voltage supply rails by first and second current sources.

3. The amplifier circuit of claim 2, wherein the output unity gain buffer and the second unity gain buffer are each directly powered from the voltage supply rails.

4. The amplifier circuit of claim 1, wherein the input amplifier receives an input signal to a non-inverting input of the input amplifier, the output unity gain buffer receives the signal from the input amplifier to a non-inverting input of the output unity gain buffer, and the second unity gain buffer receives the signal from the input amplifier to a non-inverting input of the second unity gain buffer.

5. A unity gain amplifier comprising:
an input amplifier including a base to receive an input voltage signal; and
an output unity gain buffer and a second unity gain buffer, the buffers configured to receive a signal from the input amplifier,
wherein the output unity gain buffer is configured to provide an output voltage to an amplifier output, and the second unity gain buffer is configured to provide a bootstrap signal to the input amplifier.

6. The unity gain amplifier of claim 5, wherein the input amplifier includes a first pair of complementary transistors arranged in emitter-follower configuration.

7. The unity gain amplifier of claim 6, wherein a base of each of the first pair of complementary transistors of the unity gain amplifier is configured to receive an input signal.

8. The unity gain amplifier of claim 6, wherein the output unity gain buffer includes a second pair of complementary transistors, and the second unity gain buffer includes a third pair of complementary transistors.

9. The unity gain amplifier of claim 8, wherein the second pair of complementary transistors are configured to drive an output of the unity gain amplifier, and wherein the third pair of complementary transistors are configured to drive the collectors of the first pair of complementary transistors.

10. The unity gain amplifier of claim 8, further comprising a first current source connected to a first voltage rail and a second current source connected to a second voltage rail, wherein the emitter of a first transistor of the first pair of complementary transistors is connected to the first current source, and the emitter of a second transistor of the first pair of complementary transistors is connected to the second current source.

11. The unity gain amplifier of claim 10, wherein the collector of a first transistor of the second pair of complementary transistors is connected to the first voltage rail and wherein the collector of a second transistor of the second pair of complementary transistors is connected to the second voltage rail.

12. The unity gain amplifier of claim 11, wherein the collector of a first transistor of the third pair of complementary transistors is connected to the first voltage rail and wherein the collector of a second transistor of the third pair of complementary transistors is connected to the second voltage rail.

13. The unity gain amplifier of claim 12, wherein a base of the first transistor of the second pair of complementary transistors is connected to the first current source and wherein a base of the second transistor of the second pair of complementary transistors is connected to the second current source.

14. The unity gain amplifier of claim 13, wherein a base of the first transistor of the third pair of complementary transistors is connected to the first current source and wherein a base of the second transistor of the third pair of complementary transistors is connected to the second current source.

15. An amplifier circuit comprising:
an input amplifier including a first pair of complementary transistors arranged in an emitter-follower configuration, the input amplifier configured to receive an input signal at the bases of the first pair of complementary transistors;
an output unity gain buffer configured to receive an output signal from the input amplifier and to provide an output voltage to an amplifier output utilizing a second pair of complementary transistors; and
a second unity gain buffer configured to receive the output signal from the input amplifier and to provide a bootstrap signal to the input amplifier, the second unity gain buffer including a third pair of complementary transistors configured to drive the collectors of the first pair of complementary transistors.

16. The amplifier circuit of claim 15, further comprising a first current source connected to a first voltage rail and a second current source connected to a second voltage rail, wherein the emitter of a first transistor of the first pair of complementary transistors is connected to the first current source, and wherein the emitter of a second transistor of the first pair of complementary transistors is connected to the second current source.

17. The amplifier circuit of claim 16, wherein the collector of a first transistor of the second pair of complementary transistors is connected to the first voltage rail and the collector of a second transistor of the second pair of complementary transistors is connected to the second voltage rail, and wherein the collector of a first transistor of the third pair of complementary transistors is connected to the first voltage rail and the collector of a second transistor of the third pair of complementary transistors is connected to the second voltage rail.

18. The amplifier circuit of claim 16, wherein a base of the first transistor of the second pair of complementary transistors is connected to the first current source, a base of the second transistor of the second pair of complementary transistors is connected to the second current source, a base of the first transistor of the third pair of complementary transistors is connected to the first current source, and a base of the second transistor of the third pair of complementary transistors is connected to the second current source.

* * * * *